US009048161B2

(12) United States Patent
Xu et al.

(10) Patent No.: US 9,048,161 B2
(45) Date of Patent: Jun. 2, 2015

(54) METHOD FOR FABRICATING SENSOR

(71) Applicant: BEIJING BOE OPTOELECTRONICS TECHNOLOGY CO., LTD., Beijing (CN)

(72) Inventors: Shaoying Xu, Beijing (CN); Zhenyu Xie, Beijing (CN); Xu Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/127,353

(22) PCT Filed: Nov. 16, 2012

(86) PCT No.: PCT/CN2012/084771
§ 371 (c)(1),
(2) Date: Dec. 18, 2013

(87) PCT Pub. No.: WO2014/015582
PCT Pub. Date: Jan. 30, 2014

(65) Prior Publication Data
US 2014/0335641 A1    Nov. 13, 2014

(30) Foreign Application Priority Data
Jul. 26, 2012 (CN) .......................... 2012 1 0262962

(51) Int. Cl.
*H01L 21/00* (2006.01)
*H01L 27/146* (2006.01)
(52) U.S. Cl.
CPC .... *H01L 27/14683* (2013.01); *H01L 27/14676* (2013.01)

(58) Field of Classification Search
USPC .................... 438/57, 59, 65, 66, 73, 151, 155
See application file for complete search history.

(56) References Cited

U.S. PATENT DOCUMENTS 6,300,159 B1 * 10/2001 Mochizuki ...................... 438/67
7,902,004 B2 * 3/2011 Weisfield et al. ............. 438/151
(Continued)

FOREIGN PATENT DOCUMENTS

CN    102629610 A    8/2012
JP    2011-233877 A    11/2011

OTHER PUBLICATIONS

International Search Report mailed Feb. 5, 2013; PCT/CN2012/084771.
First Chinese Office Action Issued Jul. 3, 2014; Appln. No. 201210262962.5.
International Preliminary Report on Patentability dated Jan. 27, 2015; PCT/CN2012/084771.
(Continued)

*Primary Examiner* — Kevin M Picardat
(74) *Attorney, Agent, or Firm* — Ladas & Parry LLP

(57) ABSTRACT

A method for fabricating a sensor includes: forming, on a base substrate, a pattern of a source electrode and a drain electrode, a pattern of a data line, a pattern of a receiving electrode, a pattern of a photodiode, and a pattern of a transparent electrode disposed by using a first patterning process; forming a pattern of an ohmic layer by using a second patterning process; forming a pattern of an active layer by using a third patterning process; forming a pattern of a gate insulating layer by using a fourth patterning process, wherein the gate insulating layer has a via hole above the transparent electrode; and forming a pattern of a gate electrode, a pattern of a gate line, and a pattern of a bias line connected to the transparent electrode via the via hole above the transparent electrode by using a fifth patterning process.

18 Claims, 4 Drawing Sheets

(56) References Cited

U.S. PATENT DOCUMENTS

| | | | |
|---|---|---|---|
| 8,497,562 B2* | 7/2013 | Ishida et al. | 257/458 |
| 8,729,478 B2* | 5/2014 | Tredwell et al. | 250/362 |
| 2003/0201396 A1 | 10/2003 | Lee | |
| 2008/0245968 A1* | 10/2008 | Tredwell et al. | 250/370.09 |
| 2011/0127593 A1* | 6/2011 | Hayashi | 257/292 |
| 2012/0153173 A1* | 6/2012 | Chang et al. | 250/370.08 |

OTHER PUBLICATIONS

Korean Office Action dated Jan. 30, 2015; Appln. No. 10-2013-7035113.

Second Chinese Office Action dated Feb. 15, 2015; Appln. No. 201210262962.5

* cited by examiner

US 9,048,161 B2

METHOD FOR FABRICATING SENSOR

FIELD OF THE ART

Embodiments of the invention relate to a method for fabricating a sensor.

BACKGROUND

For healthy reasons, various non-invasive medical diagnosis methods are becoming widely accepted by people. Among the various non-invasive medical diagnosis methods, Computed Tomography (CT) is already generally used. An indispensable component used in CT equipments is an X-ray sensor.

FIG. 1 illustrates a basic configuration of an X-ray sensor. The X-ray sensor 12 comprises a plurality of scan lines 15, a plurality of data lines 16 and a plurality of sensing elements, each of the sensing elements comprises a photodiode 13 and a field effect transistor (FET) 14. The gate of the FET 14 is connected to a corresponding scan line 15 of the X-ray sensor 12, the drain of the FET 14 is connected to a corresponding data line 16 of the X-ray sensor, and the source of the FET 14 is connected to the photodiode 13. One end of the date lines 16 is connected to a data readout circuit 18 via a connecting pin 17.

The working principle of the above X-ray sensor is as follows: the X-ray sensor 12 supplies a scan drive signal via the scan lines 15 to control the ON/OFF state of the FET 14 of each sensing element. When the FET 14 is turned on, the photocurrent signal generated by the photodiode 13 is output sequentially via the data line 16 connected to the FET 14 and the data readout circuit 18, and capturing of the photocurrent signal is realized by controlling timing of signals on the scan line 15 and the data line 16. That is to say, the capturing of the photocurrent signal generated by the photodiode 13 is controlled by controlling the ON/OFF state of the FET 14.

Currently, X-ray sensors generally employ a thin film transistor (TFT) plate configuration. Such an X-ray sensor may have many layers in its cross section. For example, each sensing element comprises a substrate, a gate electrode layer, a gate insulating layer, an active layer, a source electrode and a drain electrode layer, a passivation layer, PIN junction of the PIN photoelectric sensor, a transparent electrode window layer, and a bias line layer as well as a light-shield strip layer. Detailed patterning layers may differ from each other for different X-ray sensors, depending on the specific configuration of the sensors.

Individual patterning layers of the X-ray sensor are generally formed via patterning processes and each patterning process generally comprises steps of masking, developing, exposing, etching and peeling. That is to say, multiple patterning processes are needed to realize multiple patterning layers of the sensor. For example, 9 to 11 patterning processes are needed to form a multi-layer X-ray sensor as described above, thereby 9 to 11 masks are required, which makes the fabrication cost high and the process complicated and the production capacity difficult to increase.

SUMMARY

An objective of the invention is to provide a method for fabricating a sensor, so as to solve the problem of sensors having high production cost and complicated fabrication processes and difficulty in improving the production capacity of the conventional art.

A first aspect of the invention provides a method for fabricating a sensor comprising:

forming, on a base substrate, a pattern of a source electrode and a drain electrode, a pattern of a data line connected to the drain electrode, a pattern of a receiving electrode connected to the source electrode, a pattern of a photodiode disposed on the receiving electrode, and a pattern of a transparent electrode disposed on the photodiode by using a first patterning process, wherein the source electrode and the drain electrode are disposed opposed to each other to form a channel;

forming a pattern of an ohmic layer disposed on the source electrode and the drain electrode by using a second patterning process;

forming a pattern of an active layer which is disposed on the ohmic layer and overlays the channel by using a third patterning process;

forming a pattern of a gate insulating layer using a fourth patterning process, wherein the gate insulating layer has a via hole above the transparent electrode; and forming a pattern of a gate electrode which is disposed on the gate insulating layer and over the channel, a pattern of a gate line connected to the gate electrode, and a pattern of a bias line connected to the transparent electrode by way of the via hole above the transparent electrode by using a fifth patterning process.

The sensor fabricated using the fabrication method in accordance with the embodiment of the invention is a top gate TFT device, and the sensor can be fabricated with less patterning processes. Therefore, in comparison with the conventional art, it reduces the number of used mask as well as the production cost and simplifies the production process, thereby significantly improves the production capacity and the yield rate.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

NUMERAL REFERENCES

Figure 1:
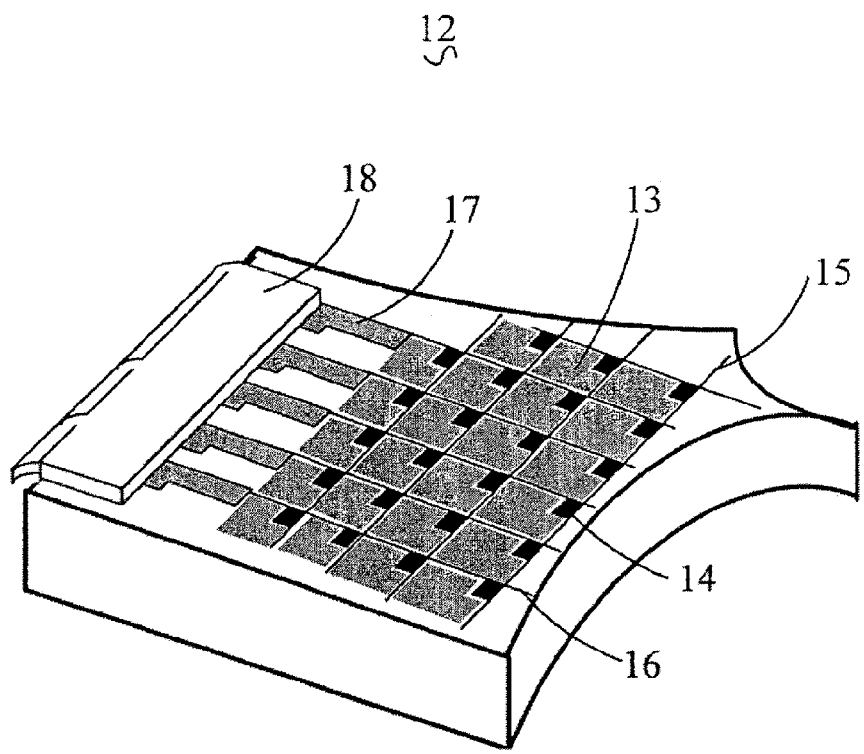
FIG. 1 schematically illustrates a three-dimensional (3D) configuration of a conventional sensor.

12: sensor; 13: photodiode; 14: FET
15: scan line 16: data line 17: connecting pin
18: data readout circuit 30: gate line 31: data line
32: base substrate 33: source electrode 34: drain electrode
35: ohmic layer 36: active layer 37: gate insulating layer
38: gate electrode 44: passivation layer 40: photodiode
41: transparent electrode 39: receive electrode; 40a: N-type semiconductor
40b: I-type semiconductor 40c: P-type semiconductor 42: bias line

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In embodiments of the invention described below, a sensor may be an X-ray sensor or other type of sensors, such as a sensor transmitting signals via photo-electric conversion. The following descriptions and drawings are directed to a single sensing element, though other sensing elements may be formed in the same way.

An embodiment of the invention provides a method for fabricating a sensor to address the technical problems of sensors having high fabrication cost and complicated fabrication processes in the conventional art. The method comprises:

Step 101: a first patterning process is used to form, on a substrate 32, a pattern of a source electrode 33 and a drain electrode 34, a pattern of a data line 31 connected to the drain electrode 34, a pattern of a receiving electrode 39 connected to the source electrode 33, a pattern of a photodiode 40 disposed on the receiving electrode 39, and a pattern of a transparent electrode 41 disposed on the photodiode 40, where the source electrode 33 and the drain electrode 34 are disposed as opposed to each other to form a channel.

Figure 2:
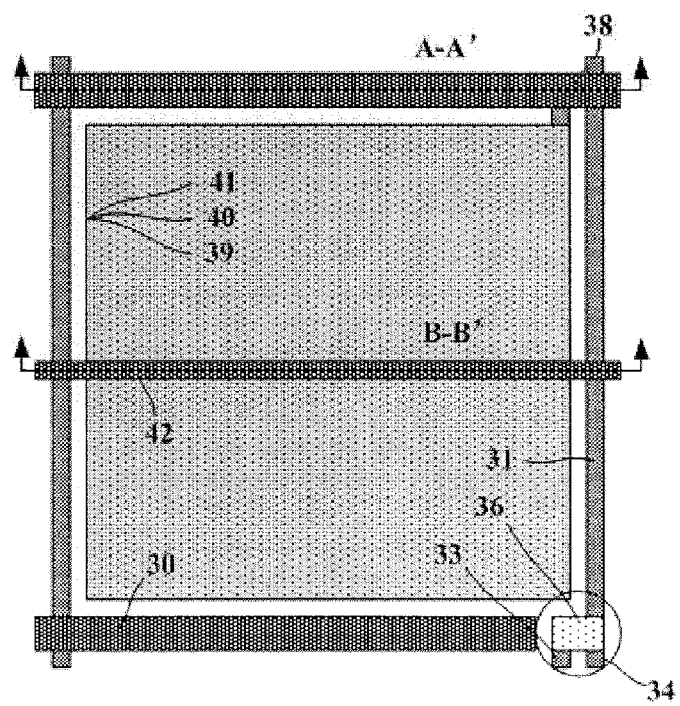
FIG. 2 is a top view of a sensing element of a sensor fabricated with a fabrication method in accordance with an embodiment of the invention.
Figure 3A:
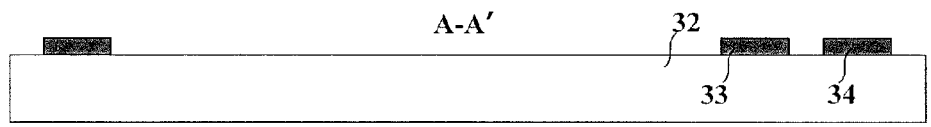
FIG. 3a is a cross section view taken along the line A-A' of FIG. 2 after the first patterning process for the sensing element in accordance with an embodiment of the invention.
Figure 3B:
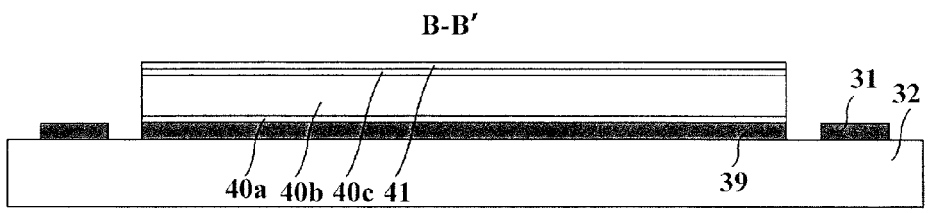
FIG. 3b is a cross section view taken along the line B-B' of FIG. 2 after the first patterning process for the sensing element in accordance with an embodiment of the invention.
Figure 6A:
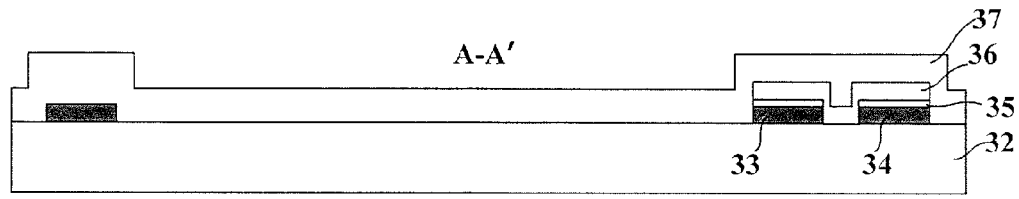
FIG. 6a is a cross section view taken along the line A-A' of FIG. 2 after the fourth patterning process for the sensing element in accordance with an embodiment of the invention.
Figure 6B:
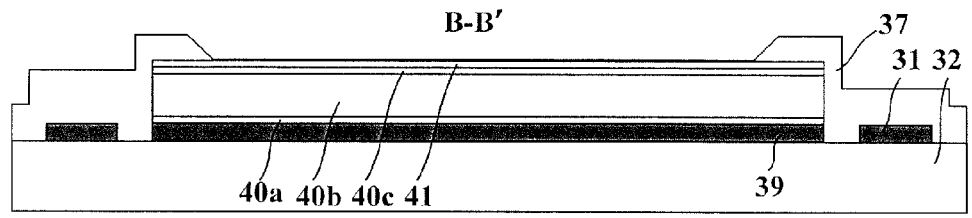
FIG. 6b is a cross section view taken along the line B-B' of FIG. 2 after the fourth patterning process for the sensing element in accordance with an embodiment of the invention.
Figure 7A:
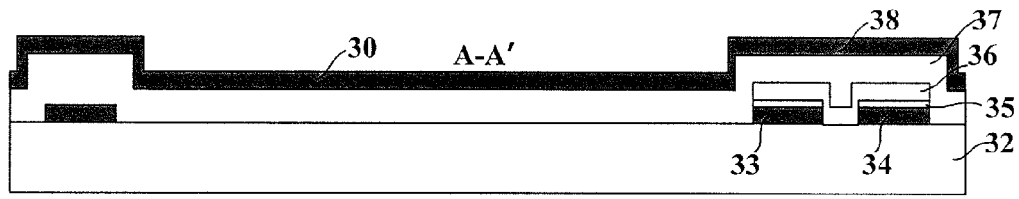
FIG. 7a is a cross section view taken along the line A-A' of FIG. 2 after the fifth patterning process for the sensing element in accordance with an embodiment of the invention.
Figure 7B:
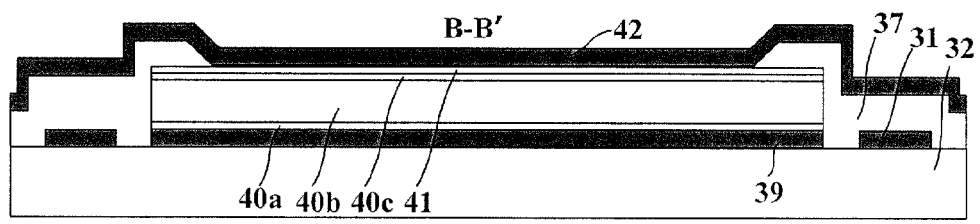
FIG. 7b is a cross section view taken along the line B-B' of FIG. 2 after the fifth patterning process for the sensing element in accordance with an embodiment of the invention.
Figure 8A:
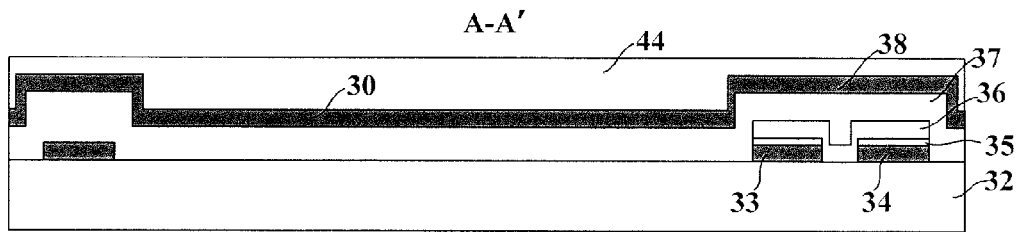
FIG. 8a is a cross section view taken along the line A-A' of FIG. 2 after the sixth patterning process for the sensing element in accordance with an embodiment of the invention.
Figure 8B:
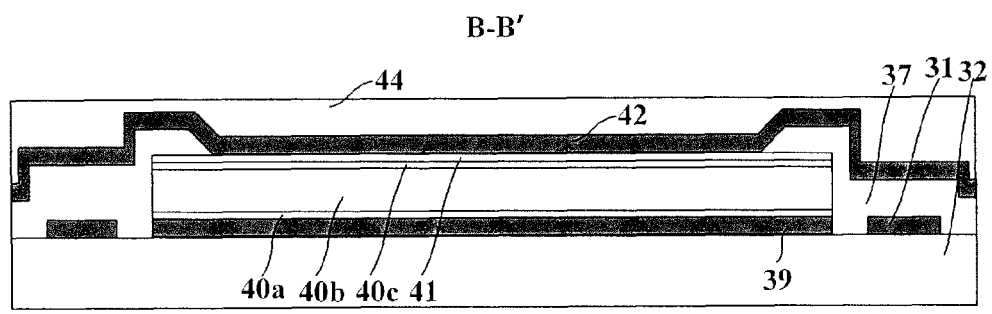
FIG. 8b is a cross section view taken along the line B-B' of FIG. 2 after the sixth patterning process for the sensing element in accordance with an embodiment of the invention.

FIGS. 3a and 3b illustrate cross sections of the base substrate after the first patterning process. FIGS. 2, 8a and 8b are respectively the top view and the cross sections of the sensing element finally obtained after six processes. Therefore, the base substrates as illustrated in FIGS. 3a and 3b are only cross sections taken along the lines A-A' and B-B" of FIG. 2 and do not represent real cross sections of the base substrate of FIG. 2. Similarly, FIGS. 4a to 7b are illustrated in the same way.

Generally, a patterning process sequentially comprises steps of substrate cleaning, film forming, photoresist application, exposure, developing, etching, photoresist removal and so on. The substrate may be cleaned using de-ionized water or an organic cleanser. The film forming process is used to form the structural layers to be patterned. For example, a metal layer is generally formed using Physical Vapor Deposition (PVD) (such as magnetron sputtering), and then wet etched to form a pattern. While a non-metal layer is usually formed using Chemical Vapor Deposition (CVD) and then dry etched to form a pattern. Patterning processes in the following steps are the same and will not be elaborated.

Specifically, in an embodiment of the invention, the above step 101 may comprise the following steps:

101a: sequentially depositing a data line material layer, a photodiode material layer and a transparent conductive material layer on the base substrate 32 and applying a photoresist onto the transparent conductive material layer;

101b: exposing and developing the photoresist on the substrate using a mask having a light-transmitting portion, a partial-light-transmitting portion and a light-blocking portion to obtain a photoresist pattern having a photoresist-completely-removed region, a photoresist-partially-removed region and a photoresist-completely-retained region;

101c: etching the photoresist-completely-removed region on the substrate to form the pattern of the transparent electrode 41, the pattern of the photodiode 40 and the pattern of the receiving electrode 39; and 101d: aching the photoresist-partially-removed region on the substrate, removing the photoresist in the photoresist-partially-removed region and retaining the photoresist in the photoresist-completely-retained region, and then etching and removing the photoresist to form the pattern of the source electrode 33 and the drain electrode 34, and the pattern of the data line 31.

In the above description, positive photoresist is used as an example of the photoresist, in which the light-transmitting portion, the partial-light-transmitting portion and the light-blocking portion of the mask are respectively used to expose the photoresist completely, partially and not at all, and the photoresist is developed to obtain the photoresist-completely-removed region, photoresist-partially-removed region and photoresist-completely-retained region. The photoresist in the photoresist-completely-retained region is substantially completely retained.

In the case that the photodiode is a PIN photodiode, depositing the photodiode material layer on the data line material layer of the above step 101a may comprise sequentially depositing the following layers on the data line material layer: a N-type semiconductor layer (n+a-Si), an I-type semiconductor layer (a-Si) and a P-type semiconductor layer (p+a-Si). More specifically, the N-type semiconductor layer is deposited on the data line material layer, the I-type semiconductor layer is deposited on the N-type semiconductor layer and the P-type semiconductor layer is deposited on the I-type semiconductor layer.

In the above step 101b, the light-blocking portion of the mask correspondingly forms the region having the receiving electrode 39, the PIN photodiode 40 and the transparent electrode 41; the partial-light-transmitting portion of the mask correspondingly forms the region having the source electrode 33, the drain electrode 34 and the data line 31. The mask may be a dual-tone mask (such as a gray-tone mask or a half-tone mask).

In the above 101c, the pattern of the transparent electrode 41 may be formed via wet etching. Alternatively, the pattern of the transparent electrode 41 may be formed at the same time with the pattern of the photodiode 40 using dry etching.

In an embodiment, materials of the source electrode 33, the drain electrode 34, the data line 31 and the receiving electrode 39 are the same.

Figure 4A:
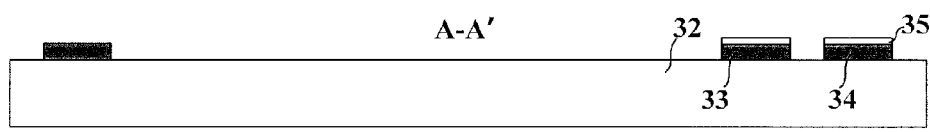
FIG. 4a is a cross section view taken along the line A-A' of FIG. 2 after the second patterning process for the sensing element in accordance with an embodiment of the invention.
Figure 4B:
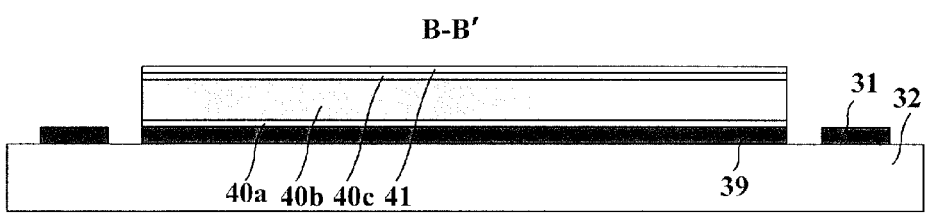
FIG. 4b is a cross section view taken along the line B-B' of FIG. 2 after the second patterning process for the sensing element in accordance with an embodiment of the invention.

Step 102: a patterning process is used to form a pattern of an ohmic layer 35 on top of the source electrode 33 and the drain electrode 34. Cross sections after the second patterning process are illustrated in FIGS. 4a and 4b.

Figure 5A:
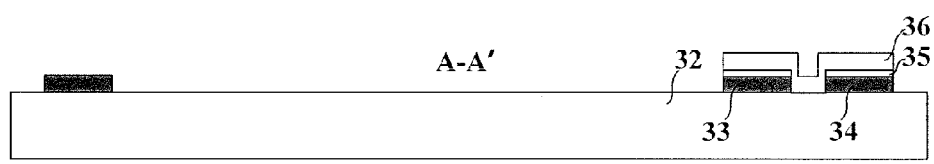
FIG. 5a is a cross section view taken along the line A-A' of FIG. 2 after the third patterning process for the sensing element in accordance with an embodiment of the invention.
Figure 5B:
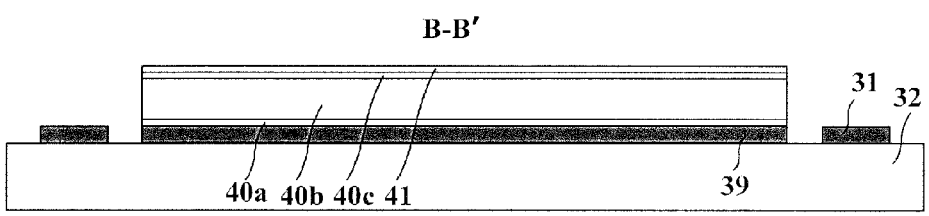
FIG. 5b is a cross section view taken along the line B-B' of FIG. 2 after the third patterning process for the sensing element in accordance with an embodiment of the invention.

Step 103: a patterning process is used to form a pattern of an active layer 36 which is disposed on the ohmic layer 35 and overlays the channel. Cross sections after the third patterning process are illustrated in FIGS. 5a and 5b.

Step 104: a patterning process is used to from a pattern of a gate insulating layer 37 which has a via hole above the transparent electrode 41. Cross sections after the fourth patterning process are illustrated in FIGS. 6a and 6b.

Step 105: a patterning process is used to form a pattern of a gate electrode 38 disposed on the gate insulating layer 37 and over the channel, a pattern of a gate line 30 connected to the gate electrode 38 and a pattern of the bias line 42 which is disposed on the transparent electrode 41 and connected to the transparent electrode 41 by way of the via hole. Cross sections after the fifth patterning process are illustrated in FIGS. 7a and 7b. In an embodiment, materials of the data electrode 38, the gate line 30 and the bias line 42 are the same.

Furthermore, the method of the embodiment may further comprises the following step after step 105:

Step 106: a patterning process is used to form a pattern of a passivation layer 44 overlaying the substrate, where the passivation layer 44 has a signal-transmitting region via hole. For cross sections after the sixth patterning process please refer to FIGS. 8a and 8b.

Step 106 is optional, as the invention can still be realized without step 106. Therefore, in an embodiment, the method for fabricating the sensor may only comprises the above steps 101 to 105.

It is seen from above that the fabrication method for the sensor of the invention can use five or six patterning processes in total. In comparison with the prior art, it reduces the number of used masks as well as the production cost and simplifies the production process, thereby significantly improving the production capacity and the yield rate.

FIG. 2 is a top view of a sensing element of a sensor fabricated with the method in accordance with the above embodiment of the invention. FIGS. 8a and 8b are cross sections of the sensing element along the lines A-A' and B-B' of FIG. 2. The sensor comprises: a base substrate 32, a group of gate lines 30 and a group of data lines 31 arranged as crossing each other, and a plurality of sensing elements arranged in an array and defined by the group of gate lines 30 and the group of data lines 31. Each sensing element comprises a TFT device and a photodiode sensing device, in which:

the TFT device comprises: a source electrode 33 and a drain electrode 34 arranged opposed to each other to form a channel, an ohmic layer 35 disposed on the source electrode 33 and the drain electrode 34, an active layer 36 disposed on the ohmic layer 35 and overlaying the channel, a gate insulating layer 37 on the active layer 36, and a gate electrode 38 on the gate insulating layer 37 and over the channel and connected to a neighboring gate line 30, wherein the drain electrode 34 is connected to a neighboring data line 31;

the photodiode sensing device comprises: a receiving electrode 39 connected to the source electrode 33, a photodiode (PD) 40 disposed on the receiving electrode 39, a transparent electrode 41 disposed on the PD 40 and a bias line 42 disposed on the transparent electrode 41 and connected to the transparent electrode 41, where the bias line 42 is arranged as parallel to the gate line 30.

In an embodiment of the invention, the base substrate 32 may be a glass substrate, a plastic substrate or a substrate made of other materials; the gate line 30, the gate electrode 38, the date line 31, the source electrode 33, the drain electrode 34, the receiving electrode 39 and the bias line 42 may be of the same material, such as a single layer of film made of aluminum neodymium (AlNd) alloy, aluminum (Al), copper (Cu), molybdenum (Mo), molybdenum tungsten (MoW) alloy or chromium (Cr), or a multi-layer film made of any combination of these metals or alloys. The single layer or multi-layer film may have a thickness of for example 150 nm to 450 nm.

In an embodiment of the invention, a material of the ohmic layer 35 may be for example a doped semiconductor (n+a-Si); a material of the active layer 36 may be a semiconducting material, such as, amorphous silicon (a-Si), with a thickness of about 30 nm to 250 nm; a material of the gate insulating layer 37 may be silicon nitrides with a thickness of about 300 nm to 500 nm; a material of the transparent electrode 41 may be transparent conductive materials such as indium tin oxides (ITO) or indium zinc oxides (IZO).

In an embodiment of the invention, the photodiode may be a PIN photodiode, comprising: a N-type semiconductor (n+a-Si) 40a disposed on the receiving electrode 39, a I-type semiconductor (a-Si) 40b disposed on the N-type semiconductor 40a, and a P-type semiconductor (p+a-Si) 40c disposed on the I-type semiconductor 40b. A PIN photodiode has the advantages of having small junction capacitance, short transit time and high sensitivity and is therefore a preferred choice. In other embodiments of the invention, the photodiode may be a MIS (Metal-Insulator-Semiconductor)-type photodiode and the like.

Still referring to FIGS. 2, 8a and 8b, the gate insulating layer 37 overlays the whole substrate and has a via hole which is above the transparent electrode 41 and connects the transparent electrode 41 and the bias line 42. In an embodiment, the sensor further comprises a passivation layer 44 disposed on the bias line 42, the gate line 30 and the gate electrode 38 and overlays the substrate (that is, covers the whole area of the substrate), where the passivation layer 44 has a signal-transmitting region via hole (FIGS. 8a and 8b illustrate cross sections of a sensing element, therefore, the signal-transmitting region via hole at the peripheral of the base substrate is not shown). The passivation layer 44 may be made of an inorganic insulating film (such as silicon nitrides) or an organic insulating film (such as a photosensitive resin material or a non-photosensitive resin) with a thickness of, for example, 150 nm to 1500 nm.

As the sensor fabricated in accordance with the above method is a top gate TFT device, the gate electrode may effectively function as a blockage, thereby preventing the channel from being damaged by etching.

What are described above is related to the illustrative embodiments of the disclosure only and not limitative to the scope of the disclosure; the scopes of the disclosure are defined by the accompanying claims.

What is claimed is:

1. A method for fabricating a sensor comprising:
    forming, on a base substrate, a pattern of a source electrode and a drain electrode, a pattern of a data line connected to the drain electrode, a pattern of a receiving electrode connected to the source electrode, a pattern of a photodiode disposed on the receiving electrode, and a pattern of a transparent electrode disposed on the photodiode by using a first patterning process, wherein the source electrode and the drain electrode are disposed opposed to each other to form a channel;
    forming a pattern of an ohmic layer disposed on the source electrode and the drain electrode by using a second patterning process;
    forming a pattern of an active layer which is disposed on the ohmic layer and overlaying the channel by using a third patterning process;
    forming a pattern of a gate insulating layer by using a fourth patterning process, wherein the gate insulating layer has a via hole above the transparent electrode; and
    forming a pattern of a gate electrode which is disposed on the gate insulating layer and over the channel, a pattern of a gate line connected to the gate electrode, and a pattern of a bias line connected to the transparent electrode by way of the via hole above the transparent electrode by using a fifth patterning process.

2. The method of claim 1, further comprising the following step after forming the pattern of the gate electrode, the pattern of the gate line and the pattern of the bias line by using the fifth patterning process:
    forming a pattern of a passivation layer overlaying the base substrate by using a sixth patterning process, wherein the passivation layer has a signal-transmitting region via hole.

3. The method of claim 1, wherein forming the pattern of the source electrode and the drain electrode, the pattern of the data line, the pattern of the receiving electrode, the pattern of the photodiode, and the pattern of the transparent electrode by using the first patterning process comprises:
    sequentially depositing a data line material layer, a photodiode material layer and a transparent conductive material layer on the base substrate and applying a photoresist onto the transparent conductive material layer;
    exposing and developing the photoresist on the base substrate by using a mask having a light-transmitting portion, a partial-light-transmitting portion and a light-blocking portion to obtain a photoresist pattern having a photoresist-completely-removed region, a photoresist-partially-removed region and a photoresist-completely-retained region;
    etching the photoresist-completely-removed region on the base substrate to form the pattern of the transparent electrode, the pattern of the photodiode and the pattern of the receiving electrode; and
    ashing the photoresist-partially-removed region on the base substrate, removing the photoresist in the photoresist-partially-removed region, retaining the photoresist in the photoresist-completely-retained region and etching, then removing the photoresist to form the pattern of the source electrode and the drain electrode, and the pattern of the data line.

4. The method of claim 3, wherein depositing the photodiode material layer comprises sequentially depositing a N-type semiconductor layer, an I-type semiconductor layer and a P-type semiconductor layer.

5. The method of claim 3, wherein the light-blocking portion of the mask is used to form a region having the receiving electrode, the photodiode and the transparent electrode; the partial-light-transmitting portion of the mask is used to form a region having the source electrode, the drain electrode and the data line.

6. The method of claim 3, wherein the mask is a dual-tone mask.

7. The method of claim 1, wherein the pattern of the transparent electrode is formed via wet etching, or the pattern of the transparent electrode is formed at the same time with the pattern of the photodiode by using dry etching.

8. The method of claim 1, wherein the source electrode, the drain electrode, the data line and the receiving electrode are of the same material.

9. The method of claim 1, wherein the data electrode, the gate line and the bias line are of the same material.

10. The method of claim 2, wherein forming the pattern of the source electrode and the drain electrode, the pattern of the data line, the pattern of the receiving electrode, the pattern of the photodiode, and the pattern of the transparent electrode by using the first patterning process comprises:
    sequentially depositing a data line material layer, a photodiode material layer and a transparent conductive material layer on the base substrate and applying a photoresist onto the transparent conductive material layer;
    exposing and developing the photoresist on the base substrate by using a mask having a light-transmitting portion, a partial-light-transmitting portion and a light-blocking portion to obtain a photoresist pattern having a photoresist-completely-removed region, a photoresist-partially-removed region and a photoresist-completely-retained region;
    etching the photoresist-completely-removed region on the base substrate to form the pattern of the transparent electrode, the pattern of the photodiode and the pattern of the receiving electrode; and
    ashing the photoresist-partially-removed region on the base substrate, removing the photoresist in the photoresist-partially-removed region, retaining the photoresist in the photoresist-completely-retained region and etching, then removing the photoresist to form the pattern of the source electrode and the drain electrode, and the pattern of the data line.

11. The method of claim 4, wherein the light-blocking portion of the mask is used to form a region having the receiving electrode, the photodiode and the transparent electrode; the partial-light-transmitting portion of the mask is used to form a region having the source electrode, the drain electrode and the data line.

12. The method of claim 4, wherein the mask is a dual-tone mask.

13. The method of claim 5, wherein the mask is a dual-tone mask.

14. The method of claim 2, wherein the pattern of the transparent electrode is formed via wet etching, or the pattern of the transparent electrode is formed at the same time with the pattern of the photodiode by using dry etching.

15. The method of claim 3, wherein the pattern of the transparent electrode is formed via wet etching, or the pattern of the transparent electrode is formed at the same time with the pattern of the photodiode by using dry etching.

16. The method of claim 4, wherein the pattern of the transparent electrode is formed via wet etching, or the pattern of the transparent electrode is formed at the same time with the pattern of the photodiode by using dry etching.

17. The method of claim 5, wherein the pattern of the transparent electrode is formed via wet etching, or the pattern of the transparent electrode is formed at the same time with the pattern of the photodiode by using dry etching.

18. The method of claim 6, wherein the pattern of the transparent electrode is formed via wet etching, or the pattern of the transparent electrode is formed at the same time with the pattern of the photodiode by using dry etching.

* * * * *